United States Patent
Hipple et al.

(10) Patent No.: US 8,433,079 B1
(45) Date of Patent: Apr. 30, 2013

(54) MODIFIED LIMITER FOR PROVIDING CONSISTENT LOUDNESS ACROSS ONE OR MORE INPUT TRACKS

(75) Inventors: Aaron Jon Hipple, Portola Valley, CA (US); Colin McDowell, Palo Alto, CA (US)

(73) Assignee: McDowell Signal Processing, Mountain View, CA (US)

( * ) Notice: Subject to any disclaimer, the term of this patent is extended or adjusted under 35 U.S.C. 154(b) by 1415 days.

(21) Appl. No.: 12/148,011

(22) Filed: Apr. 15, 2008

Related U.S. Application Data (60) Provisional application No. 60/925,560, filed on Apr. 19, 2007.

(51) Int. Cl.
*H03G 3/00* (2006.01)

(52) U.S. Cl.
USPC ............ 381/104; 381/106; 381/107; 381/108

(58) Field of Classification Search .................. 381/104, 381/106, 107, 108
See application file for complete search history.

(56) References Cited

U.S. PATENT DOCUMENTS

| | | | | |
|---|---|---|---|---|
| 5,717,406 A * | 2/1998 | Sanderford et al. | ........... | 342/457 |
| 5,832,444 A * | 11/1998 | Schmidt | ......................... | 704/500 |
| 5,923,768 A * | 7/1999 | Frindle et al. | .................. | 381/106 |
| 6,535,846 B1 * | 3/2003 | Shashoua | ...................... | 704/225 |
| 7,072,477 B1 | 7/2006 | Kincaid | ......................... | 381/107 |
| 7,469,208 B1 | 12/2008 | Kincaid | ......................... | 704/224 |
| 2007/0113728 A1 * | 5/2007 | Weir | ................................ | 84/645 |

OTHER PUBLICATIONS

Lund, Thomas, *Control of Loudness in Digital TV*, 2006, pp. 57-65, NAB BEC Proceedings.
Vickers, Earl, *Automatic Long-Term Loudness and Dynamics Matching*, pp. 1-12, Creative Advanced Technology Center, Scotts Valley, CA.
Skovenborg, Esben, and Nielsen, Soren H., *Evaluation of Different Loudness Models with Music and Speech Material.* Oct. 2004, pp. 1-34, Presented at the 117$^{th}$ Convention of the Audio Engineering Society in San Francisco, CA, USA.
Riedmiller, Jeffrey C., *Digital Loudness Matching*, Sep. 1, 2006, pp. 1-5, Broadcast Engineering.
Riedmiller, Jeffrey C., *The Elements Controlling Loudness*, Jul. 1, 2005, pp. 1-4, Broadcast Engineering.
Riedmiller, Jeffrey C., *Working Toward Consistency in Program Loudness*, Jan. 1, 2004, pp. 1-4, Broadcast Engineering.
Zolzer, Udo, *Dynamic Range Control*, 1997, pp. 207-223, Digital Audio Signal Processing (ISBN 0-471-97226-6).

\* cited by examiner

*Primary Examiner* — Kimberly Rizkallah
*Assistant Examiner* — Timor Karimy
(74) *Attorney, Agent, or Firm* — Haverstock & Owens LLP

(57) ABSTRACT

A modified limiter of the present invention produces a consistent loudness level across one or more input tracks. The modified limiter has a target threshold, wherein signal levels below the target threshold are adjusted. The signal levels below the target threshold are adjusted by using an upward expander, which is not a time-based parameter but, instead, is based on signal levels only. A release target of the modified limiter is a highest peak within a look-ahead delay. The modified limiter is highly optimized as compared to other look-ahead limiters. As such, its processing footprint on an application such as audio management software like iTunes™, or a consumer music playback device like an iPod™, is minimal. The modified limiter is also able to be used in other technologies, such as but not limited to cell phones like an iPhone™ and set-top boxes like an Apple TV™.

46 Claims, 8 Drawing Sheets

MODIFIED LIMITER FOR PROVIDING CONSISTENT LOUDNESS ACROSS ONE OR MORE INPUT TRACKS

CROSS REFERENCE TO RELATED APPLICATIONS

The application claims priority of U.S. provisional application Ser. No. 60/925,560, filed Apr. 19, 2007, and entitled "McDSP Sound Check Pro," by the same inventors. This application incorporates U.S. provisional application Ser. No. 60/925,560, in its entirety by reference.

FIELD OF THE INVENTION

The present invention relates to the field of audio processing. More particularly, the present invention relates to a modified limiter for providing consistent loudness across one or more input tracks and/or audio streams.

BACKGROUND OF THE INVENTION

Current technology trends have been able to package consumer music playback devices into extremely convenient sizes, enabling more frequent casual listening opportunities than ever before. However, prior art consumer music playback devices suffer from a number of shortcomings. For example, a problem with prior art devices is their inability to deliver a consistent perceived loudness level from song to song, often because the dynamic range of professionally distributed music varies greatly. Environmental noises also contribute to changes in the perceived loudness level. Specifically, a loud environmental noise can overpower quiet sounds. Such changes in perceived loudness level between songs cause a frustrated user to repeatedly manually modify the volume control of such prior art devices, preventing a completely passive listening experience.

Figure 1:
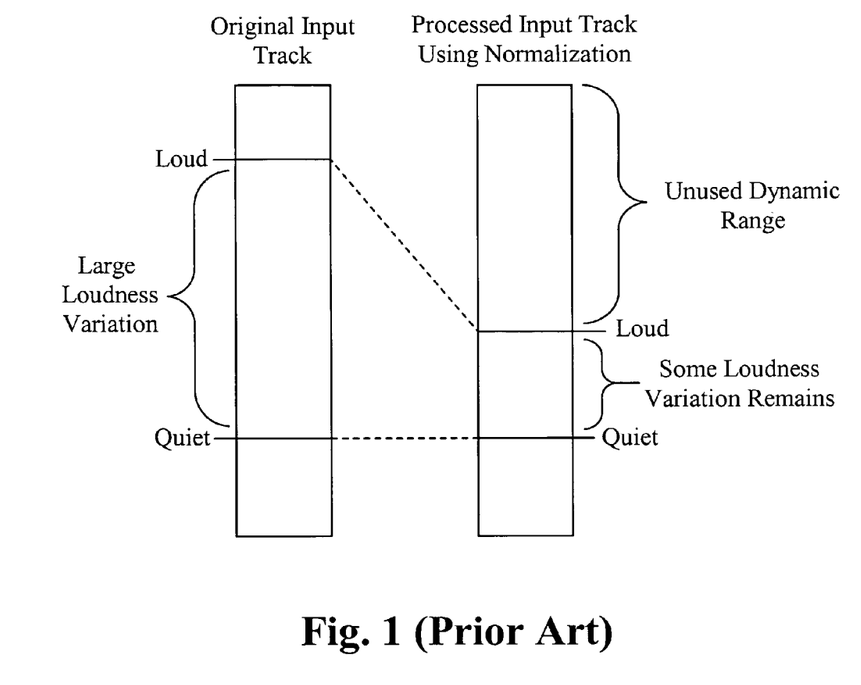
FIG. 1 illustrates an unused dynamic range of providing consistent loudness between music tracks in the prior art.

A problem with providing a consistent loudness between audio tracks is twofold: first, a ratio between signal peaks and average signal level can vary greatly, and second, human perception of loudness is not directly correlated with signal peaks or average signal level. Some prior art portable consumer music playback devices attempt to calculate a consistent loudness over audio tracks by lowering the overall track output, e.g. normalization, of louder tracks to match quiet tracks. For example, Apple Computer Inc. of California has created a complex algorithm, Sound Check™, to accurately detect a signal power of an audio track over a variety of frequencies to adjust for human perception of loudness and other criteria. However, actual results can be perceived as poor. Sound Check™ does not adequately produce consistent loudness levels in the processed audio tracks. Furthermore, as illustrated in FIG. 1, the reduced overall signal level by normalization does not make use of an entire available dynamic range of a consumer music playback device, lowering signal to noise ratio and thereby degrading overall sound quality. The complex algorithm is currently used in Apple iPod™ products.

Other prior art music playback devices use a dynamic range compressor to modify the signal peaks and long-term loudness levels of an audio track to maximize levels while providing a consistent loudness. The dynamic range compressor reduces a gain of an audio signal if its amplitude exceeds a threshold. Unlike normalization, dynamic compression applies varying levels of gain over the audio signal. However, this dynamic compression technique alone does not work well when signal transients are very fast, requiring attack times, and sometimes release times, of the dynamic range compressor to be also very fast, thus producing a great deal of distortion in a processed signal. When the dynamic range compressor is slower than the signal transients, the signal peaks overshoot the available dynamic range of the consumer music playback device, causing audio clipping.

The concept of look-ahead limiter is not new. For example, radio stations use look-ahead limiters. A look-ahead limiter anticipates and controls peaks by introducing a delay thereby allowing the device to effectively look ahead in time and anticipate changes necessary to the audio signal to fit within the allowable range. In order for the look-ahead limiter to maximize lower signal levels, extremely fast attack and release times are used to manipulate signal peaks. Specifically, large signal peaks are reduced as quickly as possible. However, similar to a dynamic range compressor, fast attack and release times create audible distortion in prior art and look-ahead limiter systems.

Music distribution channels, like radio stations, use look-ahead limiters to significantly reduce the signal peaks and achieve a more consistent average signal power. Specifically, a look-ahead limiter measures the signal peaks and applies an automatic gain control to a delayed version of a raw signal to reduce the magnitude of signal peaks. Once the signal peaks are controlled, music levels are maximized for radio broadcast. The look-ahead limiter is typically complex and sophisticated in nature. As such, the look-ahead limiter is too difficult for a consumer to use properly. Furthermore, the look-ahead limiter is computationally too expensive for the limited processing capabilities of portable consumer music playback devices. This makes the look-ahead limiter economically impractical, especially in personal portable players.

The present invention addresses at least these limitations in the prior art.

SUMMARY OF THE INVENTION

An object of the present invention is to provide a modified limiter that produces a consistent loudness level across one or more input tracks.

In one aspect of the present invention, a limiter increases signal level relative to a threshold. Signal levels below the threshold are adjusted upwardly. A delay is configured for releasing from a first peak to a subsequent peak within the delay. Typically, the threshold is variable. In some embodiments, the threshold is user defined. Alternatively, the threshold is based on a heuristic and is set during manufacture. In other embodiments, the delay is just over 1 msec (e.g. 50 samples at 44.1 kHz). Yet, in other embodiments, the subsequent peak is a next highest peak within the delay. Alternatively, the subsequent peak is a selectable peak within the delay. In some embodiments, the threshold and the delay provide a consistent perceived loudness.

In another aspect, an apparatus for producing a consistent perceived loudness level includes means for determining a target threshold or loudness level of an input track. Means for analyzing a first copy of the input track uses a limiter having the target threshold. Signal levels below the target threshold are adjusted upwardly. A second copy of the input track that is modified based on the analysis is output. This attains maximum signal levels of the input track with minimum perceived distortion. In some embodiments, the target threshold is user defined. Alternatively, the means for determining a target threshold includes means for reading each channel of the input track, means for applying a frequency weighting filter to each channel, means for calculating a RMS value for each weighted channel, means for computing an average of all RMS values, means for converting the average to a dB value and means for applying the dB value to a heuristic to obtain a target threshold. In other embodiments, the limiter comprises means for attacking a largest signal peak within a delay, means for releasing from the largest signal peak to a subsequent peak within the delay, means for adjusting signal levels below the target threshold, and means for repeating the attacking, the releasing and the adjusting until an end of the first copy of the input track is reached.

In a further aspect a method produces a consistent perceived loudness level. A target threshold or loudness level of the input track is determined. A first copy of the input track is analyzed by using a limiter having the target threshold. Signal levels below the target threshold are adjusted upwardly. A second copy of the input track modified based on the analysis is output. Maximum signal levels of the input track is attained with minimum perceived distortion. In some embodiments, the target threshold is user defined. Alternatively, the determining comprises reading each channel of the input track, applying a frequency weighting filter to each channel, calculating a RMS value for each weighted channel, computing an average of all RMS values, converting the average to a dB value and applying the dB value to a heuristic to obtain a target threshold. In other embodiments, the limiter comprises steps of attacking a largest signal peak within a delay, releasing from the largest signal peak to a subsequent peak within the delay, adjusting signal levels below the target threshold, and repeating the attacking, the releasing and the adjusting until an end of the first copy of the input track is reached.

In yet another aspect, a system produces a consistent perceived loudness level across a plurality of input tracks. The system includes a processor. An application is executed by the processor. The application is for determining a target threshold or loudness level of the input track, analyzing a first copy of the input track by using a limiter having the target threshold, wherein signal levels below the threshold are adjusted upwardly, and outputting a second copy of the input track modified based on the analysis, thereby attaining maximum signal levels of the input track with minimum perceived distortion. In some embodiments, the target threshold is user defined. Alternatively, the determining comprises reading each channel of the input track, applying a frequency weighting filter to each channel, calculating a RMS value for each weighted channel, computing an average of all RMS values, converting the average to a dB value and applying the dB value to a heuristic to obtain a target threshold. In other embodiments, the limiter comprises steps of attacking a largest signal peak within a delay, releasing from the largest signal peak to a subsequent peak within the delay, adjusting signal levels below the target threshold, and repeating the attacking, the releasing and the adjusting until an end of the first copy of the input track is reached.

In some embodiments, the limiter has a delay of just over 1 msec (e.g. 50 samples at 44.1 kHz). The limiter is used in real time during playback. In other embodiments, the target threshold ranges from −36 dB to 0 dB. Yet, in other embodiments, the limiter utilizes a temporal masking aspect of human hearing perception or approximately 100-200 milliseconds by localizing distortion to a time period where it is not perceivable.

In some embodiments, the target threshold is calculated in real time during the analysis of the first copy of the input track. Alternatively, the target threshold is calculated over a designated period of time, which is typically longer than an integration period of a human hearing system or approximately 100-200 milliseconds.

The input track is a mono audio track, a stereo audio track, or a multi-channel audio track. In some embodiments, the audio track is accompanied by a video track. In other embodiments, the audio track is a streaming audio track or a live audio track. Yet, in other embodiments, the input track and the second copy are stored together in one file, wherein the second copy is modified and configured for playback.

DETAILED DESCRIPTION OF THE INVENTION

In the following description, numerous details are set forth for purposes of explanation. However, one of ordinary skill in the art will realize that the invention can be practiced without the use of these specific details. Thus, the present invention is not intended to be limited to the embodiments shown but is to be accorded the widest scope commensurate with the principles and features described herein.

Figure 7:
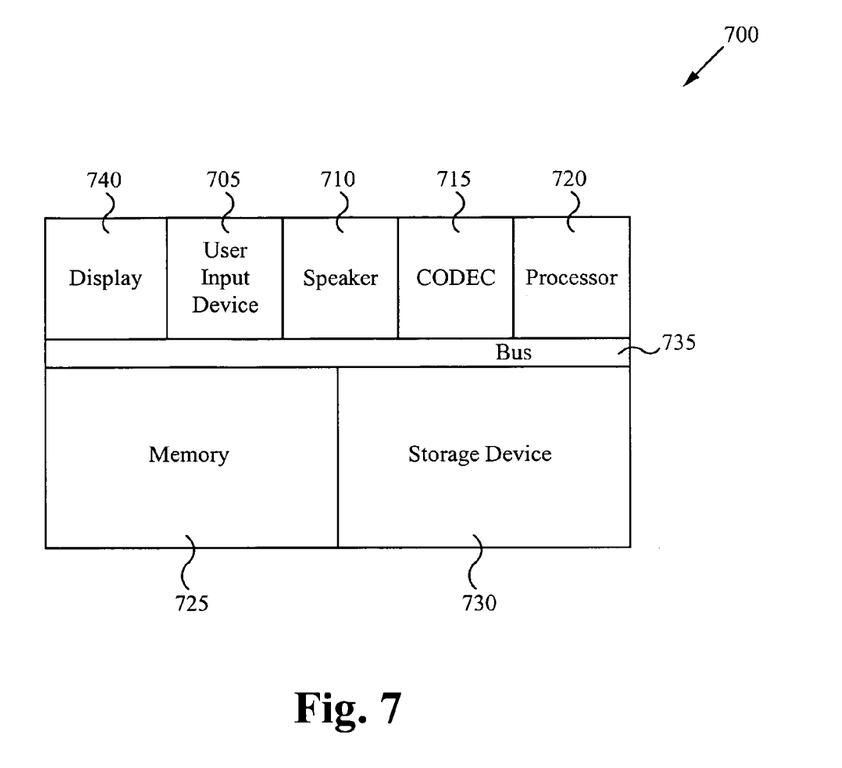
FIG. 7 illustrates a schematic graphical representation of an exemplary portable consumer music playback device in accordance with the present invention.

FIG. 7 illustrates a schematic graphical representation of an exemplary portable consumer music playback device 700 in accordance with the present invention. The portable consumer music playback device 700 stores files, such as digitally encoded files in storage device 730. In general, a hardware structure suitable for implementing the portable consumer music playback device 700 includes a display 740, an input device 705, a speaker 710, CODEC 715, a processor 720, memory 725, a storage device 730, and a bus 735. These elements are inactively coupled together. The display 740 is a screen that displays information to a user. The input device 705 is a keypad, a touch pad, a button, or a touch wheel. Other forms of the input device are possible. The speaker 710 can be inside or outside the portable consumer music playback device 700. The CODEC 715 decodes a digital input to an analog output for the speaker 710. The processor 720 needs sufficient speed to perform the operation disclosed herein without impeding playback speed of the audio signal. The memory 725 is any conventional memory known in the art. The storage device 730 is a rotating storage disk, flash memory, or any other conventional storage device. Software algorithms used to perform methods of the present invention are likely to be stored in memory 725 and processed as applications are typically processed. The hardware structure for implementing the portable consumer music playback device 700 are not intended to be exhaustive, but rather are representative to highlight some components for implementation to present invention.

Figure 3:
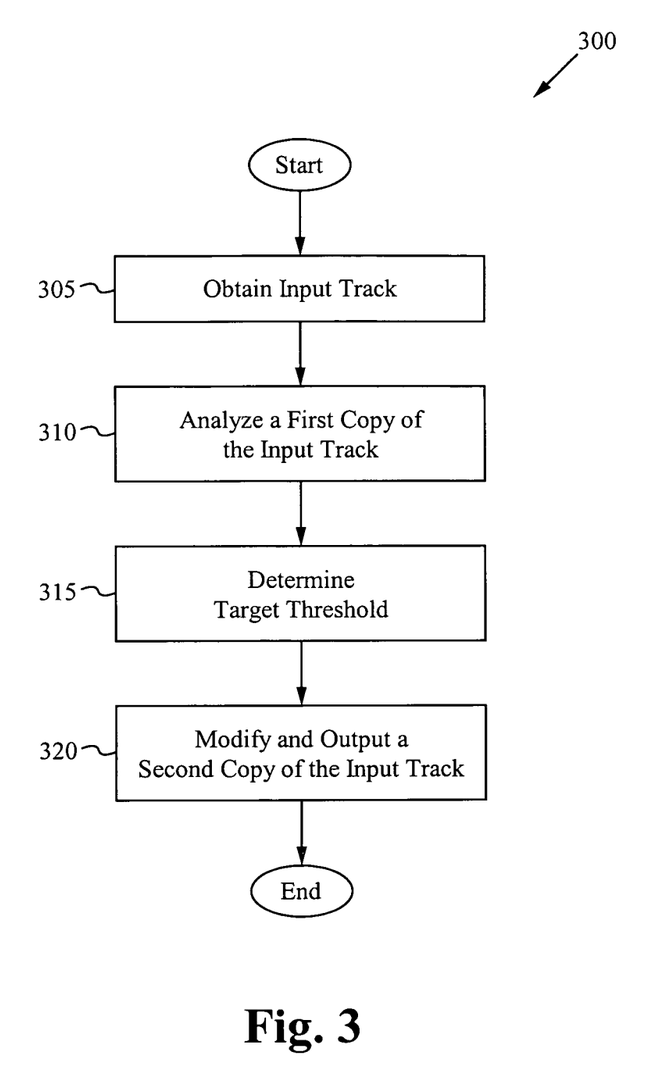
FIG. 3 illustrates a process of producing a consistent perceived loudness level in accordance with the present invention.

Embodiments of the present invention are directed to producing a consistent perceived loudness level on a playback device, such as the portable consumer music playback device described above. FIG. 3 illustrates a process 300 of producing a consistent perceived loudness level in accordance with the present invention. At a step 305, an input track is obtained. Typically, the input track is selected from a source having computational resources such as the portable consumer music playback device. Alternatively, the source is a computer. In some embodiments, the input track is an audio track. The audio track is a mono audio track, a stereo audio track, or a multi-channel audio track. In other embodiments, the audio track is accompanied by a corresponding video track.

Yet, in other embodiments, two copies of the input track are obtained at step 305: a first copy and a second copy. Preferably, the first copy is a raw signal used for analysis, and the second copy is a delayed and modified signal used for playback. At a step 310, the first copy of the input track is analyzed using a modified limiter to attain maximum signal levels of the input track with minimum perceived distortion. Preferably, the modified limiter is configured to increase an average signal level of perceived loudness of quiet peaks.

Figure 6:
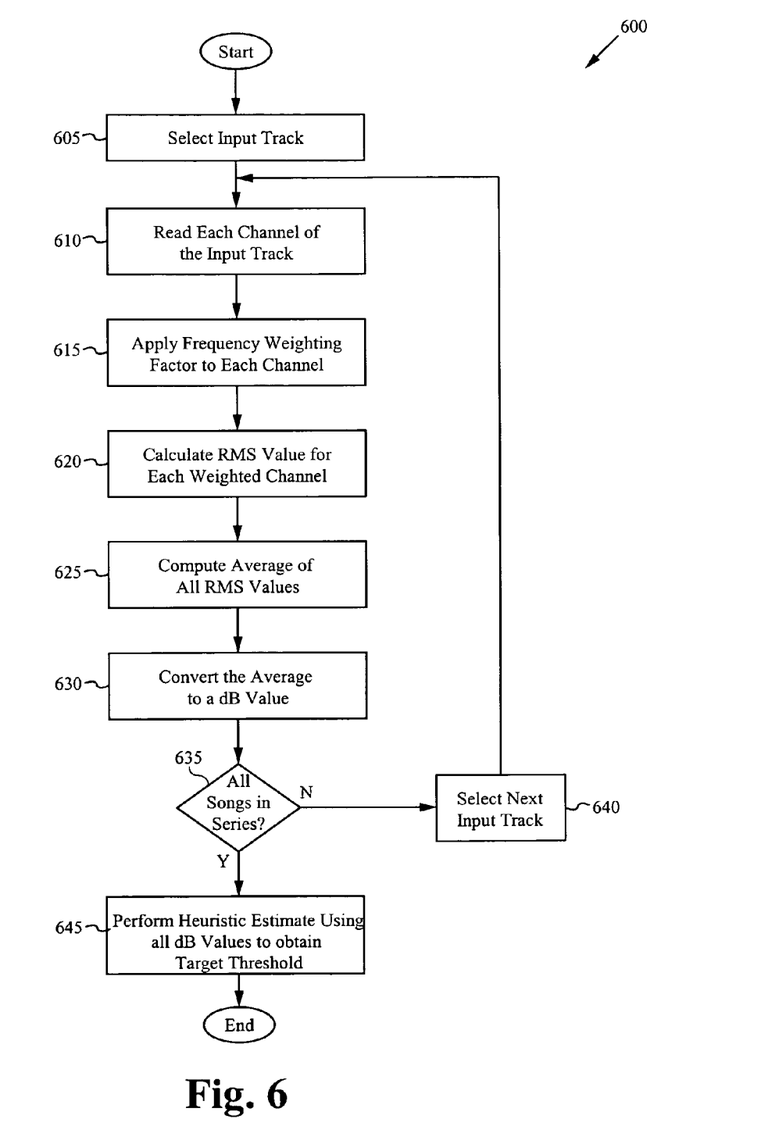
FIG. 6 illustrates a process of determining a target threshold using a McDSP Loudness Correction.

At a step 315, a target threshold (e.g. −1 dB) for the input track is determined. In some embodiments, a user is able to set the target threshold. In other embodiments, the target threshold is set at a maximum target threshold. Yet, in other embodiments, the present invention determines the target threshold. The target threshold is configured to obtain a consistent loudness level across one input track or a series of input tracks by employing the modified limiter of the present invention to maximize signal levels for each input track. Detailed discussion regarding the step 315 is illustrated in FIG. 6.

Figure 4:
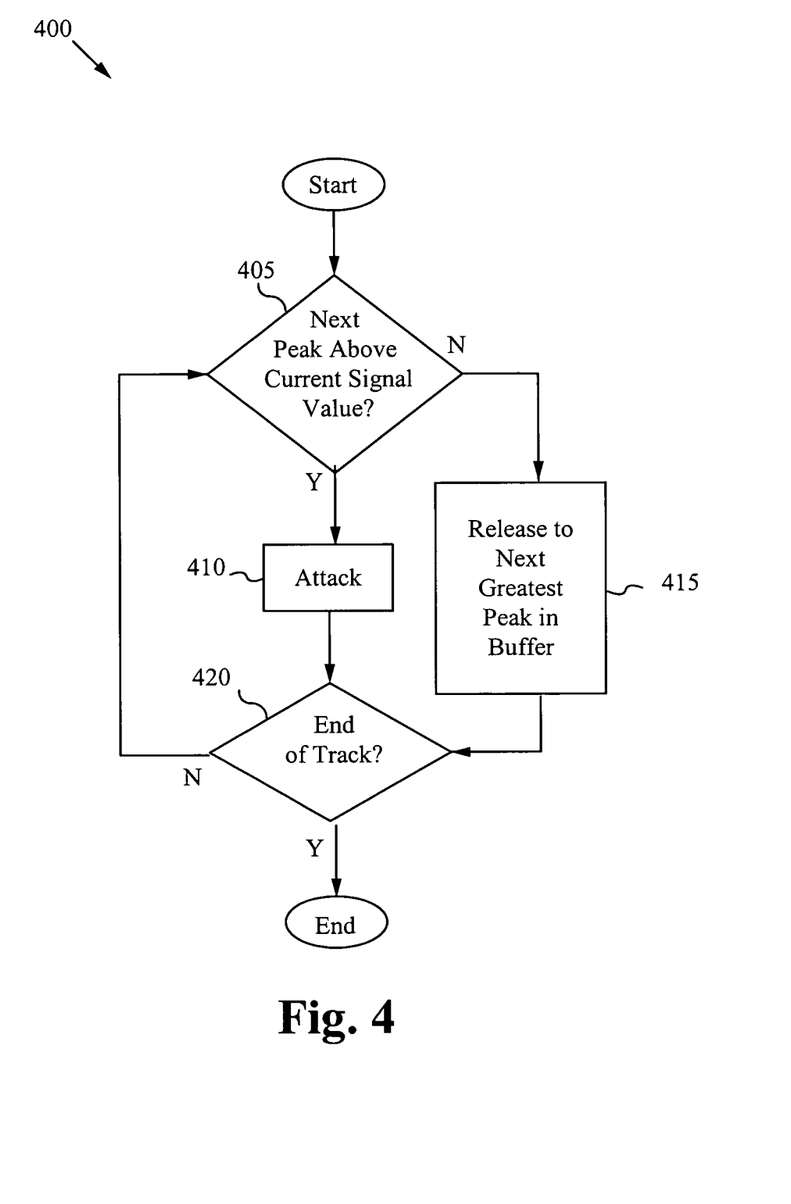
FIG. 4 illustrates a process of a modified limiter in accordance with an embodiment of the present invention.

At a step 320, the second copy of the input track is modified during playback based on the analysis done at the step 315. Detailed discussion regarding the step 320 is illustrated in FIG. 4. The process 300 ends.

As mentioned above, the present invention determines the target threshold for the one input track or for the series of input tracks. FIG. 6 illustrates a process 600 of determining the target threshold using the McDSP Loudness Correction. At a step 605, an input track is selected. At a step 610, each channel of the input track is read. For example, if the input track is an audio stereo track, then a right channel and a left channel are read. Optionally at step 615, a frequency weighting filter is applied to each channel. In some embodiments, applying the frequency weighting filter removes DC and exaggerates a frequency by 1-3 kHz. Alternatively, the frequency weighting filter is not applied. Instead, linear weighting is applied to each channel. At a step 620, a RMS value is calculated for each channel. Specifically, the RMS value for a weighted channel is calculated by taking a square root of a mean of the square of the weighted channel. At a step 625, an average RMS number of all RMS values for the input track is calculated. At a step 630, the average RMS number is converted into a corresponding dB value. At a step 635, if it is determined that another input track (e.g. in the series of input tracks) needs to be analyzed, then the another input track is selected at step 640. However, if it is determined that no other input track needs to be analyzed, then at a step 645, a heuristic estimate is performed using all dB values to determine the target threshold for the one or more input tracks. In some embodiments, the target threshold ranges from −36 dB to 0 dB. The process 600 ends.

Newer look-ahead limiters incorporate delays. A delay is applied to a processed version of an audio file, while a current audio input is used as a limiter key. These newer look-ahead limiters use a fast attack equal to a length of the delay in order to minimize distortion caused by the fast attack. However, fast release times can still cause audible distortion even with the use of the delay. As such, the fast release time is manipulated to arrive at a release target. The release target is derived from an average of values (e.g. signal peaks) in the delay. This technique reduces some audible distortion but is not entirely adequate in subjective listen evaluations.

Embodiments of the modified limiter in accordance with the present invention are more efficient than prior art look-ahead limiters. In some embodiments, the modified limiter is greater than four times more efficient, has less latency, and uses a shorter delay than prior look-ahead limiters. In addition, the modified limiter produces 20-30 dB more loudness than other look-ahead limiters. The modified limiter is preferably implemented on a consumer grade embedded DSP chip of a portable consumer music playback device such as an iPod™. In some embodiments, the consumer grade embedded DSP chip is a Motorola series DSP chip. Other consumer-grade embedded processors and DSP chips are possible.

The modified limiter preferably adapts signal peaks, even very fast ones, without any audible distortion, which is unlike standard dynamic range compressors, and attains maximum signal levels of the input track with minimum perceived distortion. In some embodiments, the modified limiter uses a small amount of delay to minimize the distortion. In some embodiments, the modified limiter has a delay just over 1 msec (e.g. 50 samples at 44.1 kHz). In other embodiments, the modified limiter takes advantage of temporal masking aspect of human hearing perception, namely temporal masking effect, to control signal peaks by localizing distortion to a time period where it is not perceivable.

As is well known in the art, temporal masking effect essentially relates to a window in time surrounding a signal peak in which signal peaks can be adjusted without detection by a human ear. By controlling those signal peaks within the undetectable region of time, the signal peaks can be significantly controlled, thereby allowing an increased average signal power without perceived distortion effects.

Figure 2:
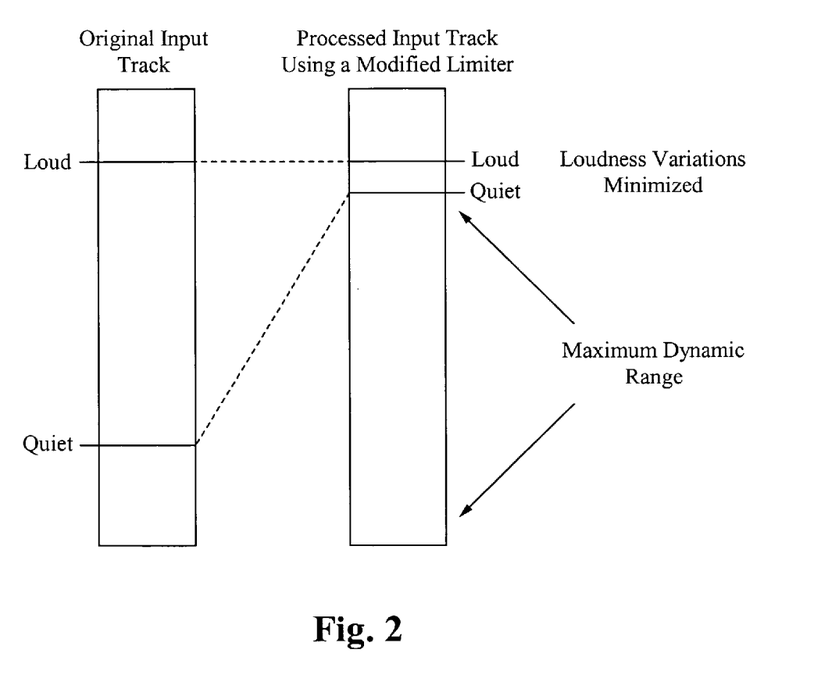
FIG. 2 illustrates an unused dynamic range of providing consistent loudness between music tracks in accordance with the present invention.

In some embodiments, the modified limiter increases lower signal levels by using an upwards expander. The upwards expander does not reduce large signal peaks, unlike standard dynamic range compressors. Instead, the upwards expander increases lower signal levels. In some embodiments, the upwards expander is configured to be manipulated such that the increase is not beyond the target threshold. The upwards expander is not a time-based parameter but, instead, is based on signal levels only. As mentioned above, the modified limiter does not reduce levels of loud tracks to match quiet ones but instead increases the average signal level of the quiet tracks. This approach has the added benefit of maximizing the use of the available dynamic range of the portable consumer music playback device since tracks are not normalized down to a lower signal level. FIG. 2 illustrates an unused dynamic range of providing consistent loudness between music tracks in accordance with the present invention. Other benefits include improved signal to noise ratio and reduced component costs in analog signal chain such as headphones, headphone amplifiers, and other digital to analog conversion parts. Because the signal peaks and average signal levels are more predictably controlled, these components are replaced for versions with lesser available dynamic range and power consumption.

Figure 8:
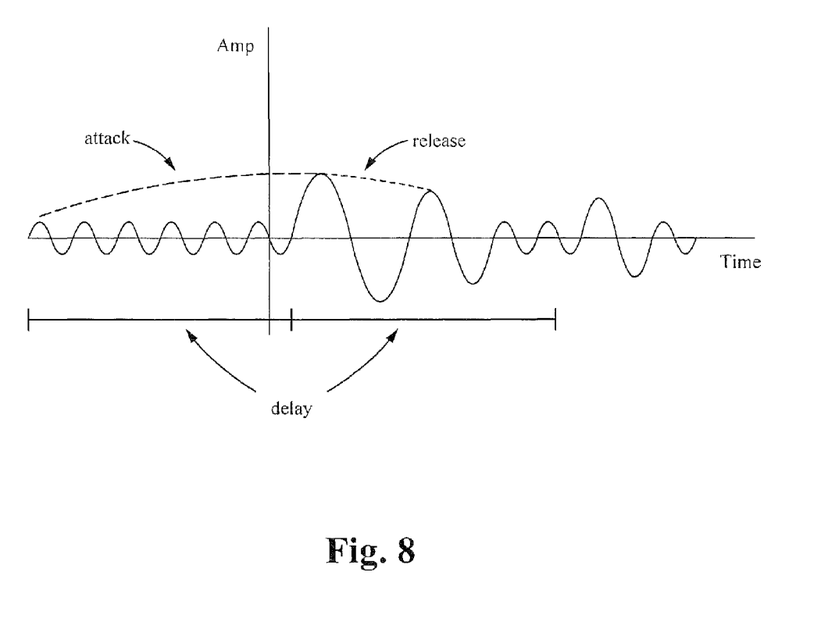
FIG. 8 illustrates an exemplary graph depicting an attack and release within a delay in accordance with the present invention.

FIG. 4 illustrates a process 400 of the modified limiter in accordance with an embodiment of the present invention. Given a current signal value, if it is determined that a successive peak is above the current signal value at step 405, then the successive peak is attacked by using a "just in time" concept at step 410. In some embodiments, the "just in time" concept allows the attack to occur over a time of the delay or some portion thereof. However, if it is determined that the successive peak is below the current value at step 405, then the current value releases to the successive peak. For example, the successive peak recovers from the current value. The modified limiter uses the successive peak as a release target instead of an average of values in the delay as the release target. The successive peak is a next highest signal peak within the delay. Preferably, using the next highest signal peak as the release target provides significantly less distortion. Alternatively, the successive peak is a selectable peak within the delay. In some embodiments, the recovery is based on a filtering aspect of the modified limiter. If an end of the track is detected at step 420, the process 400 ends. Otherwise, the process 400 continues at step 405 as described. FIG. 8 illustrates an exemplary graph depicting an attack and release within a delay in accordance with the present invention.

Variability of loudness across different music genres or within a genre is a problem in the portable consumer music playback device. In other embodiments, the modified limiter solves the loudness variation problem by attaining predictable and reliable loudness in real-time. Specifically, the modified limiter leaves large signal peaks alone, as discussed above, while small signal levels are brought up to the target threshold, which is calculated in real time from the first (e.g. analysis) pass of the input track before playback is started.

The real-time version of the modified limiter is also applicable to streaming or live audio tracks by estimating the target threshold over a designated period of time, instead of an entirely distinct and separate audio track. Preferably, this designated period of time is nominally longer than an integration period of a human hearing system or approximately 100-200 milliseconds.

In some embodiments, the modified limiter is not used in real-time because the user wants to conserve battery power of the portable consumer music playback device. As such, the input track on the portable consumer music playback device is processed only once during a first playback. The modified input track is stored together with the original input track on the portable consumer music playback device. Subsequently, the user is able to selectively listen to the modified input track.

In other embodiments, the use of the real-time version of the modified limiter is not possible due to processing restrictions on the portable consumer music playback device. As such, the input track is processed on a computing system such as a computer before the processed or modified copy of the input track is transferred and stored on the portable consumer music playback device. For example, the modified limiter is integrated into an audio management software like iTunes™. Alternatively, both the original input track and the modified input track are transferred and stored together on the portable consumer music playback device.

Figure 5:
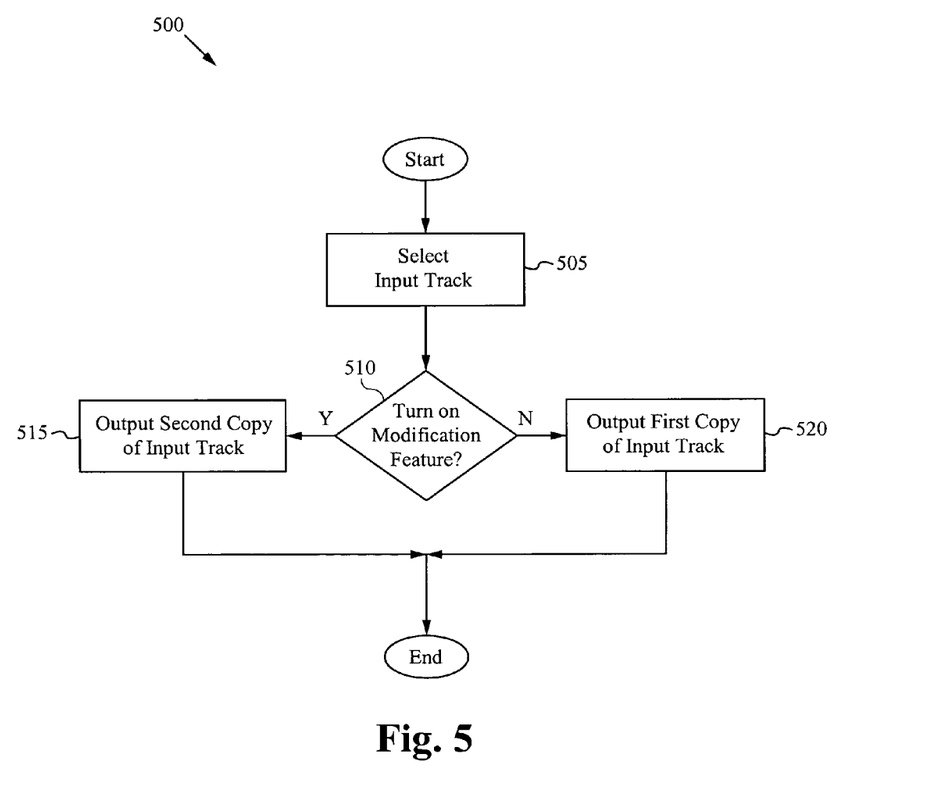
FIG. 5 illustrates a process of selectively listening to an input track on a portable consumer playback device in accordance with an embodiment of the present invention.

FIG. 5 illustrates a process 500 of selectively listening to an input track on the portable consumer playback device in accordance with an embodiment of the present invention. After the user selects the input track on the portable consumer music playback device at a step 505, the user is given an option to select a modification feature at a step 510. If the user selects the modification feature, the modified second copy of the input track is played instead of the original input track at a step 515. Alternatively, if the user does not select the modification feature, the original input track is played at a step 520. After outputting the first or the second copy of the input track, the process 500 ends. The process 500 is applicable to loudness matching in real-time playback devices and is an alternate way of distributing audio content to consumers.

The modified limiter is highly optimized compared to other look-ahead limiters. As such, its processing footprint on an application like the audio management software discussed above, or a consumer music playback device like an iPod™, is minimal. The modified limiter is also able to be used in other technologies, such as but not limited to cell phones like an iPhone™ and set-top boxes like an Apple TV™. For example, the modified limiter is used in iPhone™ to maximize signal levels between callers, song plays, or both, and the modified limiter is used in Apple TV™ to achieve a selected loudness level while at the same time insuring both quiet and loud parts of the show are sufficiently audible. Other playback devices are contemplated.

Furthermore, the modified limiter can be used during a post-production phase of film creation to edit an audio track. Instead of re-recording portions of the audio track, the limiter can produce a consistent perceived loudness level by controlling loud portions of the audio track and increasing quiet portions of the audio track to an average signal level of perceived loudness.

The present invention has been described in terms of specific embodiments incorporating details to facilitate the understanding of principles of construction and operation of the invention. Such reference herein to specific embodiments and details thereof is not intended to limit the scope of the claims appended hereto. A person skilled in the art would appreciate that various modifications and revisions to the modified limiter for providing consistent perceived loudness level across one or more input tracks will occur. Consequently, the claims should be broadly construed, consistent with the spirit and scope of the invention, and should not be limited to their exact, literal meaning.

We claim:

1. An apparatus producing a consistent perceived loudness level comprising:
   a. means for analyzing a first copy of an input track by using a limiter having a target threshold, wherein signal levels below the target threshold are adjusted upwardly, wherein the limiter configured to attack to a largest signal peak within a delay and release from the largest signal peak to a subsequent peak within the delay; and
   b. means for outputting a second copy modified based on the analysis, thereby attaining maximum signal levels with minimum perceived distortion.

2. The apparatus of claim 1 wherein the target threshold is user defined.

3. The apparatus of claim 1 further comprising means for determining the target threshold of the input track.

4. The apparatus of claim 3 wherein the determining comprises:
   a. means for reading each channel of the input track;
   b. means for applying a frequency weighting filter to each channel;
   c. means for calculating a RMS value for each weighted channel;
   d. means for computing an average of all RMS values;
   e. means for converting the average to a dB value; and
   f. means for applying the dB value to a heuristic to obtain a target threshold.

5. The apparatus of claim 1 wherein the limiter is further configured to:
   a. adjust signal levels below the target threshold; and
   b. repeatedly attack, release and adjust until an end of the first copy of the input track is reached.

6. The apparatus of claim 1 wherein the delay is just over 1 msec.

7. The apparatus of claim 1 wherein the limiter utilizes a temporal masking aspect of human hearing perception by localizing distortion to a time period where it is not perceivable.

8. The apparatus of claim 1 wherein the input track and the second copy are stored together in one file, wherein the second copy is modified and configured for playback.

9. The apparatus of claim 1 wherein the limiter is used in real time during playback.

10. The apparatus of claim 1 wherein the target threshold ranges from −36 dB to 0 dB.

11. The apparatus of claim 1 wherein the target threshold is calculated in real time during the analysis of the first copy of the input track.

12. The apparatus of claim 1 wherein the target threshold is calculated over a designated period of time, the designated period of time longer than an integration period of a human hearing system.

13. The apparatus of claim 1 wherein the input track is an audio track, the audio track is one of a mono audio track, a stereo audio track, and a multi-channel audio track.

14. The apparatus of claim 13 wherein the audio track is accompanied by a video track.

15. The apparatus of claim 1 wherein the input track is an audio track, the audio track is one of a streaming audio track and a live audio track.

16. A method of producing a consistent perceived loudness level comprising:
   a. analyzing a first copy of an input track by using a limiter having a target threshold, wherein signal levels below the target threshold are adjusted upwardly, wherein the limiter is configured to attack to a largest signal peak within a delay and release from the largest signal peak to a subsequent peak within the delay; and
   b. outputting a second copy of the input track, the second copy modified based on the analysis, thereby attaining maximum signal levels with minimum perceived distortion.

17. The method of claim 16 wherein the target threshold is user defined.

18. The method of claim 16 further comprising determining the target threshold of the input track.

19. The method of claim 18 wherein the determining comprises:
   a. reading each channel of the input track;
   b. applying a frequency weighting filter to each channel;
   c. calculating a RMS value for each weighted channel;
   d. computing an average of all RMS values;
   e. converting the average to a dB value; and
   f. applying the dB value to a heuristic to obtain a target threshold.

20. The method of claim 16 wherein the limiter is further configured to:
   a. adjust signal levels below the target threshold; and
   b. repeatedly attack, release and adjust until an end of the first copy of the input track is reached.

21. The method of claim 16 wherein the delay is just over 1 msec.

22. The method of claim 16 wherein the limiter utilizes a temporal masking aspect of human hearing perception by localizing distortion to a time period where it is not perceivable.

23. The method of claim 16 wherein the input track and the second copy are stored together in one file, wherein the second copy is modified and configured for playback.

24. The method of claim 16 wherein the limiter is used in real time during playback.

25. The method of claim 16 wherein the target threshold ranges from −36 dB to 0 dB.

26. The method of claim 16 wherein the target threshold is calculated in real time during the analysis of the first copy of the input track.

27. The method of claim 16 wherein the target threshold is calculated over a designated period of time, the designated period of time longer than an integration period of a human hearing system.

28. The method of claim 16 wherein the input track is an audio track, the audio track is one of a mono audio track, a stereo audio track, and a multi-channel audio track.

29. The method of claim 28 wherein the audio track is accompanied by a video track.

30. The method of claim 16 wherein the input track is an audio track, the audio track is one of a streaming audio track and a live audio track.

31. A system for producing a consistent perceived loudness level comprising:
   a. a processor; and
   b. an application executed by the processor, the application for:
      i. analyzing a first copy of an input track by using a limiter having a target threshold, wherein signal levels below the target threshold are adjusted upwardly, wherein the limiter is configured to attack to a largest signal peak within a delay and release from the largest signal peak to a subsequent peak within the delay; and
      ii. outputting a second copy of the input track, the second copy modified based on the analysis, thereby attaining maximum signal levels with minimum perceived distortion.

32. The system of claim 31 wherein the target threshold is user defined.

33. The system of claim 31 wherein the analyzing comprises determining a target threshold of the input track.

34. The system of claim 33 wherein the determining comprises:
   a. reading each channel of the input track;
   b. applying a frequency weighting filter to each channel;
   c. calculating a RMS value for each weighted channel;
   d. computing an average of all RMS values;
   e. converting the average to a dB value; and
   f. applying the dB value to a heuristic to obtain a target threshold.

35. The system of claim 31 wherein the limiter is further configured to:
   a. adjust signal levels below the target threshold; and
   b. repeatedly attack, release and adjust until an end of the first copy of the input track is reached.

36. The system of claim 31 wherein the delay is just over 1 msec.

37. The system of claim 31 wherein the limiter utilizes a temporal masking aspect of human hearing perception by localizing distortion to time period where it is not perceivable.

38. The method of claim 31 wherein the input track and the second copy are stored together in one file, wherein the second copy is modified and configured for playback.

39. The system of claim 31 wherein the limiter is used in real time during playback.

40. The system of claim 31 wherein the target threshold ranges from −36 dB to 0 dB.

41. The system of claim 31 wherein the target threshold is calculated in real time during the analysis of the first copy of the input track.

42. The system of claim 31 wherein the target threshold is calculated over a designated period of time, the designated period of time longer than an integration period of a human hearing system.

43. The system of claim 31 wherein the input track is an audio track, the audio track is one of a mono audio track, a stereo audio track, and a multi-channel audio track.

44. The system of claim 43 wherein the audio track is accompanied by a video track.

45. The system of claim 31 wherein the input track is an audio track, the audio track is one of a streaming audio track and a live audio track.

46. The system of claim 31 wherein the processor is coupled to a portable consumer playback device.

* * * * *